(12) United States Patent
Wang

(10) Patent No.: US 11,825,655 B2
(45) Date of Patent: Nov. 21, 2023

(54) MEMORY STRUCTURE

(71) Applicant: Powerchip Semiconductor Manufacturing Corporation, Hsinchu (TW)

(72) Inventor: Zih-Song Wang, Nantou County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 135 days.

(21) Appl. No.: 17/469,898

(22) Filed: Sep. 9, 2021

(65) Prior Publication Data
US 2023/0047688 A1  Feb. 16, 2023

(30) Foreign Application Priority Data
Aug. 10, 2021   (TW) ................................. 110129528

(51) Int. Cl.
*H10B 43/27* (2023.01)

(52) U.S. Cl.
CPC .................................... *H10B 43/27* (2023.02)

(58) Field of Classification Search
CPC ........ H10B 41/00–70; H10B 43/00–50; H10B 99/22; H01L 27/105; H01L 27/11514; H01L 27/11521; H01L 27/11551; H01L 27/11553; H01L 27/11556; H01L 27/11563; H01L 27/11568; H01L 27/11578; H01L 27/1158; H01L 27/11582; H01L 25/1159; H01L 25/11597; H01L 29/66931; H01L 29/7606;
(Continued)

(56) References Cited

U.S. PATENT DOCUMENTS 6,208,557 B1 * 3/2001 Bergemont ........... H01L 29/792
 365/185.15
9,530,503 B2 * 12/2016 Chang .................... G11C 16/08
(Continued)

FOREIGN PATENT DOCUMENTS

CN    105514026    4/2016
TW    202127632    7/2021

OTHER PUBLICATIONS

"Office Action of Taiwan Counterpart Application", dated Apr. 22, 2022, p. 1-p. 7.

*Primary Examiner* — Eric A. Ward
*Assistant Examiner* — Zachary Taylor Nix
(74) *Attorney, Agent, or Firm* — JCIPRNET

(57) ABSTRACT

A memory structure including a substrate and memory cells is provided. The memory cells are stacked on the substrate. Each memory cell includes a first conductive layer, a first gate, a second gate, a second conductive layer, a channel layer, and a first charge storage layer. The first conductive layer, the first gate, the second gate, and the second conductive layer are sequentially stacked. The first conductive layer and the first gate are electrically insulated from each other. The first gate and the second gate are electrically insulated from each other. The second gate and the second conductive layer are electrically insulated from each other. The first gate and the second gate are electrically insulated from the channel layer. The first conductive layer and the second conductive layer are electrically connected to the channel layer. The first charge storage layer is located between the first gate and the channel layer.

20 Claims, 3 Drawing Sheets

(58) Field of Classification Search
CPC ....... H01L 21/823864; H01L 29/66825; H01L 29/788–7889; G11C 16/0466–0475; G11C 27/005; G11C 11/5671
See application file for complete search history.

(56) References Cited

U.S. PATENT DOCUMENTS

| | | | |
|---|---|---|---|
| 9,589,982 B1 | 3/2017 | Cheng et al. | |
| 10,847,523 B1* | 11/2020 | Yeh ........................ | H10B 43/10 |
| 2017/0077118 A1* | 3/2017 | Cheng .................... | H10B 43/20 |
| 2018/0247944 A1* | 8/2018 | Yano .................... | H01L 29/7926 |
| 2018/0269210 A1* | 9/2018 | Tezuka ................... | H10B 43/27 |
| 2022/0028882 A1* | 1/2022 | Lee ........................ | H10B 43/27 |
| 2022/0199639 A1* | 6/2022 | Yeh ........................ | H10B 43/27 |
| 2022/0254799 A1* | 8/2022 | Lue ........................ | H10B 43/27 |

* cited by examiner

MEMORY STRUCTURE

CROSS-REFERENCE TO RELATED APPLICATION

This application claims the priority benefit of Taiwan application serial no. 110129528, filed on Aug. 10, 2021. The entirety of the above-mentioned patent application is hereby incorporated by reference herein and made a part of this specification.

BACKGROUND OF THE INVENTION

Field of the Invention

The invention relates to a semiconductor structure, and particularly relates to a memory structure.

Description of Related Art

The non-volatile memory (e.g., flash memory) is capable of storing, reading, and erasing data repeatedly and has the advantages such as the stored data does not disappear even after the power supply is turned off, short data access time, and low power consumption. Therefore, the non-volatile memory has become a memory widely used in personal computers and electronic products.

Currently, a three-dimensional (3D) NOR flash memory has been developed, which uses channel hot electron (CHE) injection for the program operation. However, how to improve the programming efficiency of the 3D NOR flash memory is the goal of continuous efforts at present.

SUMMARY OF THE INVENTION

The invention provides a memory structure, which can effectively improve the programming efficiency.

The invention provides a memory structure, which includes a substrate and memory cells. The memory cells are stacked on the substrate. Each of the memory cells includes a first conductive layer, a first gate, a second gate, a second conductive layer, a channel layer, and a first charge storage layer. The first conductive layer, the first gate, the second gate, and the second conductive layer are sequentially stacked. The first conductive layer and the first gate are electrically insulated from each other. The first gate and the second gate are electrically insulated from each other. The second gate and the second conductive layer are electrically insulated from each other. The channel layer is located on one side of the first conductive layer, one side of the first gate, one side of the second gate, and one side of the second conductive layer. The first gate and the second gate are electrically insulated from the channel layer. The first conductive layer and the second conductive layer are electrically connected to the channel layer. The first charge storage layer is located between the first gate and the channel layer.

According to an embodiment of the invention, in the memory structure, each of the memory cells may further include a first dielectric layer, a second dielectric layer, a third dielectric layer, a fourth dielectric layer, a fifth dielectric layer, and a sixth dielectric layer. The first dielectric layer is located between the first charge storage layer and the channel layer and between the first gate and the first conductive layer. The second dielectric layer is located between the first gate and the first charge storage layer. The third dielectric layer is located between the first conductive layer and the channel layer, between the first dielectric layer and the channel layer, between the second gate and the channel layer, and between the second conductive layer and the channel layer. The fourth dielectric layer is located between the first gate and the second gate. The fifth dielectric layer is located between the second gate and the second conductive layer. The sixth dielectric layer is located between the first dielectric layer and the first conductive layer. The first conductive layer may be electrically connected to the channel layer by the dielectric breakdown of the third dielectric layer located between the first conductive layer and the channel layer. The second conductive layer may be electrically connected to the channel layer by the dielectric breakdown of the third dielectric layer located between the second conductive layer and the channel layer.

According to an embodiment of the invention, in the memory structure, the third dielectric layer may be a continuous structure located on one side of the first conductive layer, one side of the first gate, one side of the second gate, and one side of the second conductive layer.

According to an embodiment of the invention, in the memory structure, each of the memory cells may further include a first dielectric layer, a second dielectric layer, a third dielectric layer, a fourth dielectric layer, a fifth dielectric layer, and a sixth dielectric layer. The first dielectric layer is located between the first charge storage layer and the channel layer and between the first gate and the first conductive layer. The second dielectric layer is located between the first gate and the first charge storage layer. The third dielectric layer is located between the second gate and the channel layer. The fourth dielectric layer is located between the first gate and the second gate. The fifth dielectric layer is located between the second gate and the second conductive layer. The sixth dielectric layer is located between the first dielectric layer and the first conductive layer.

According to an embodiment of the invention, in the memory structure, the first conductive layer may directly contact the channel layer, and the second conductive layer may directly contact the channel layer.

According to an embodiment of the invention, in the memory structure, the third dielectric layer may further be located between the second gate and the fourth dielectric layer and between the second gate and the fifth dielectric layer.

According to an embodiment of the invention, in the memory structure, each of the memory cells may further include a second charge storage layer. The second charge storage layer is located between the second gate and the channel layer.

According to an embodiment of the invention, in the memory structure, each of the memory cells may further include a first dielectric layer, a second dielectric layer, a third dielectric layer, a fourth dielectric layer, a fifth dielectric layer, a sixth dielectric layer, and a seventh dielectric layer. The first dielectric layer is located between the first charge storage layer and the channel layer, between the first gate and the first conductive layer, and between the first gate and the second gate. The second dielectric layer is located between the first gate and the first charge storage layer. The third dielectric layer is located between the second charge storage layer and the channel layer, between the second gate and the second conductive layer, and between the second gate and the first gate. The fourth dielectric layer is located between the second gate and the second charge storage layer. The fifth dielectric layer is located between the first dielectric layer and the third dielectric layer between the first gate and the second gate. The sixth dielectric layer is located between the first dielectric layer and the first conductive layer. The seventh dielectric layer is located between the third dielectric layer and the second conductive layer.

According to an embodiment of the invention, in the memory structure, the first conductive layer may directly contact the channel layer, and the second conductive layer may directly contact the channel layer.

According to an embodiment of the invention, in the memory structure, two adjacent memory cells may share the first conductive layer.

According to an embodiment of the invention, in the memory structure, the components in the two adjacent memory cells sharing the first conductive layer may have a symmetrical configuration relationship.

According to an embodiment of the invention, in the memory structure, two adjacent memory cells may share the second conductive layer.

According to an embodiment of the invention, in the memory structure, the components in the two adjacent memory cells sharing the second conductive layer may have a symmetrical configuration relationship.

According to an embodiment of the invention, in the memory structure, the materials of the first conductive layer, the second gate, and the second conductive layer are, for example, doped polysilicon. The material of the first gate is, for example, metal.

According to an embodiment of the invention, in the memory structure, the materials of the first conductive layer and the second conductive layer are, for example, doped polysilicon. The materials of the first gate and the second gate are, for example, metal.

According to an embodiment of the invention, in the memory structure, a material of the channel layer is, for example, a semiconductor material.

According to an embodiment of the invention, in the memory structure, the semiconductor material is, for example, polysilicon.

According to an embodiment of the invention, in the memory structure, the material of the first charge storage layer is, for example, a charge trapping material.

According to an embodiment of the invention, in the memory structure, the charge trapping material is, for example, silicon nitride.

According to an embodiment of the invention, the memory structure may be a 3D NOR flash memory structure.

Based on the above description, in the memory structure according to the invention, the memory cells are stacked on the substrate, each of the memory cells has the first conductive layer, the first gate, the second gate, and the second conductive layer sequentially stacked, and the first charge storage layer is located between the first gate and the channel layer. Therefore, the memory structure according to the invention can use the source side injection (SSI) method to program the memory cell, thereby improving the programming efficiency. In addition, since the memory cell can have the assist gate, the design of the memory cell is more flexible.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
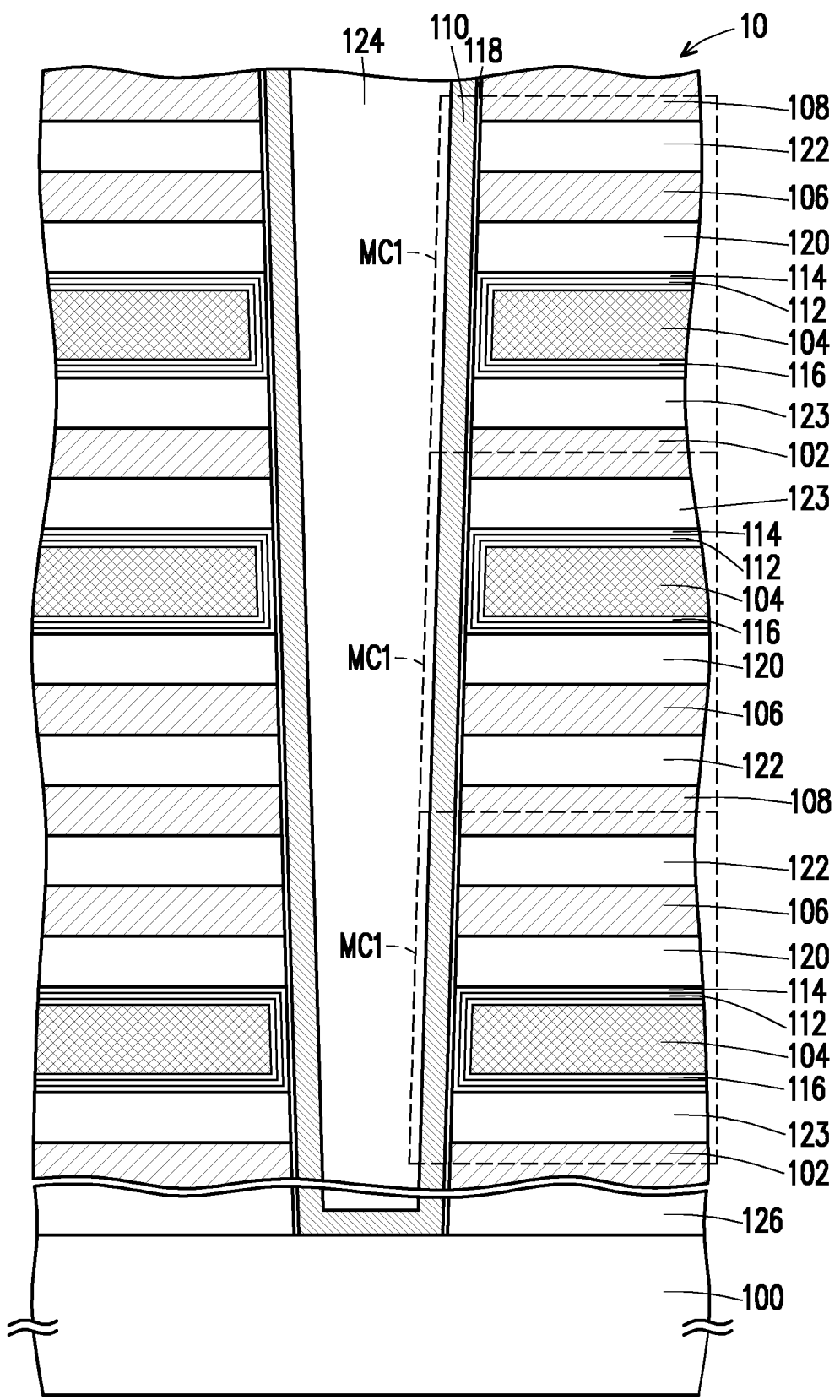
FIG. 1 is a cross-sectional view illustrating a memory structure according to an embodiment of the invention.

FIG. 1 is a cross-sectional view illustrating a memory structure according to an embodiment of the invention.

Referring to FIG. 1A, a memory structure 10 includes a substrate 100 and memory cells MC1. The memory structure 10 may be a 3D NOR flash memory structure. The substrate 100 may be a semiconductor substrate such as a silicon substrate. In addition, the required doped region (not shown) may be formed in the substrate 100 according to product design requirements.

The memory cells MC1 are stacked on the substrate 100. Each of the memory cells MC1 includes a conductive layer 102, a gate 104, a gate 106, a conductive layer 108, a channel layer 110, and a charge storage layer 112. The conductive layer 102, the gate 104, the gate 106, and the conductive layer 108 are sequentially stacked. The conductive layer 102 and the gate 104 are electrically insulated from each other. The gate 104 and the gate 106 are electrically insulated from each other. The gate 106 and the conductive layer 108 are electrically insulated from each other. The materials of the conductive layer 102, the gate 106, and the conductive layer 108 are, for example, doped polysilicon. The material of the gate 104 is, for example, metal such as tungsten.

The channel layer 110 is located on one side of the conductive layer 102, one side of the gate 104, one side of the gate 106, and one side of the conductive layer 108. In some embodiments, the channel layer 110 may have a cross-sectional shape similar to a U shape. The material of the channel layer 110 is, for example, a semiconductor material. In some embodiments, the semiconductor material is, for example, polysilicon. The gate 104 and the gate 106 are electrically insulated from the channel layer 110. The conductive layer 102 and the conductive layer 108 are electrically connected to the channel layer 110.

The charge storage layer 112 is located between the gate 104 and the channel layer 110. The charge storage layer 112 may further be located between the gate 104 and the conductive layer 102 and between the gate 104 and the gate 106. The charge storage layer 112 can be used to store charges. In some embodiments, the charge storage layer 112 may have an insulating effect. In some embodiments, the charge storage layer 112 may have a U-shaped cross-sectional shape. The material of the charge storage layer 112 is, for example, a charge trapping material. In some embodiments, the charge trapping material is, for example, silicon nitride.

In addition, each of the memory cells MC1 may further include a dielectric layer 114, a dielectric layer 116, a dielectric layer 118, a dielectric layer 120, a dielectric layer 122, and a dielectric layer 123. The dielectric layer 114 is located between the charge storage layer 112 and the channel layer 110 and between the gate 104 and the conductive layer 102. The dielectric layer 114 may further be located between the gate 104 and the gate 106. The dielectric layer 114 may be used as a tunneling dielectric layer. The conductive layer 102 and the gate 104 may be electrically insulated from each other by the dielectric layer 114. The gate 104 and the channel layer 110 may be electrically insulated from each other by the dielectric layer 114. The gate 104 and the gate 106 may be electrically insulated from each other by the dielectric layer 114. In some embodiments, the dielectric layer 114 may have a U-shaped cross-sectional shape. The material of the dielectric layer 114 is, for example, silicon oxide.

The dielectric layer 116 is located between the gate 104 and the charge storage layer 112. The dielectric layer 116 may be used as a blocking dielectric layer. The conductive layer 102 and the gate 104 may be electrically insulated from each other by the dielectric layer 116. The gate 104 and the channel layer 110 may be electrically insulated from each other by the dielectric layer 116. The gate 104 and the gate 106 may be electrically insulated from each other by the dielectric layer 116. In some embodiments, the dielectric layer 116 may have a U-shaped cross-sectional shape. The material of the dielectric layer 116 is, for example, silicon oxide.

The dielectric layer 118 is located between the conductive layer 102 and the channel layer 110, between the dielectric layer 114 and the channel layer 110, between the gate 106 and the channel layer 110, and between the conductive layer 108 and the channel layer 110. The gate 104 and the channel layer 110 may be electrically insulated from each other by the dielectric layer 118. The gate 106 and the channel layer 110 may be electrically insulated from each other by the dielectric layer 118. On the other hand, before operating the memory cell MC1, the large voltage may be applied to the conductive layer 102 and the conductive layer 108, so that the conductive layer 102 may be electrically connected to the channel layer 110 by the dielectric breakdown of the dielectric layer 118 located between the conductive layer 102 and the channel layer 110, and the conductive layer 108 may be electrically connected to the channel layer 110 by the dielectric breakdown of the dielectric layer 118 located between the conductive layer 108 and the channel layer 110. Furthermore, the dielectric layer 118 may be a continuous structure located on one side of the conductive layer 102, one side of the gate 104, one side of the gate 106, and one side of the conductive layer 108.

The dielectric layer 120 is located between the gate 104 and the gate 106. For example, the dielectric layer 120 may be located between the dielectric layer 114 and the gate 106. The gate 104 and the gate 106 may be electrically insulated from each other by the dielectric layer 120. The material of the dielectric layer 120 is, for example, silicon oxide.

The dielectric layer 122 is located between the gate 106 and the conductive layer 108. The gate 106 and the conductive layer 108 may be electrically insulated from each other by the dielectric layer 122. The material of the dielectric layer 122 is, for example, silicon oxide.

The dielectric layer 123 is located between the dielectric layer 114 and the conductive layer 102. The conductive layer 102 and the gate 104 may be electrically insulated from each other by the dielectric layer 123. The material of the dielectric layer 123 is, for example, silicon oxide.

In some embodiments, the memory structure 10 may further include at least one of a dielectric layer 124 and a dielectric layer 126. The dielectric layer 124 is located on the channel layer 110. The material of the dielectric layer 124 is, for example, silicon oxide. The dielectric layer 126 is located between the memory cell MC1 and the substrate 100. The material of the dielectric layer 126 is, for example, silicon oxide.

In the present embodiment, two adjacent memory cells MC1 may share the conductive layer 102. The components in the two adjacent memory cells MC1 sharing the conductive layer 102 may have a symmetrical configuration relationship. In the present embodiment, two adjacent memory cells MC1 may share the conductive layer 108. The components in the two adjacent memory cells MC1 sharing the conductive layer 108 may have a symmetrical configuration relationship.

Based on the above embodiments, in the memory structure 10, the memory cells MC1 are stacked on the substrate 100, each of the memory cells MC1 has the conductive layer 102, the gate 104, the gate 106, and the conductive layer 108 sequentially stacked, and the charge storage layer 112 is located between the gate 104 and the channel layer 110. When operating the memory cell MC1, the gate 104 can be used as a control gate, the gate 106 can be used as an assist gate, the conductive layer 102 can be electrically connected to the bit line, and the conductive layer 108 can be electrically connected to the source line. Therefore, the source side injection method can be used to program the memory cell MC1, thereby improving the programming efficiency. In addition, since the memory cell MC1 can have the assist gate, the design of the memory cell MC1 is more flexible.

Figure 2:
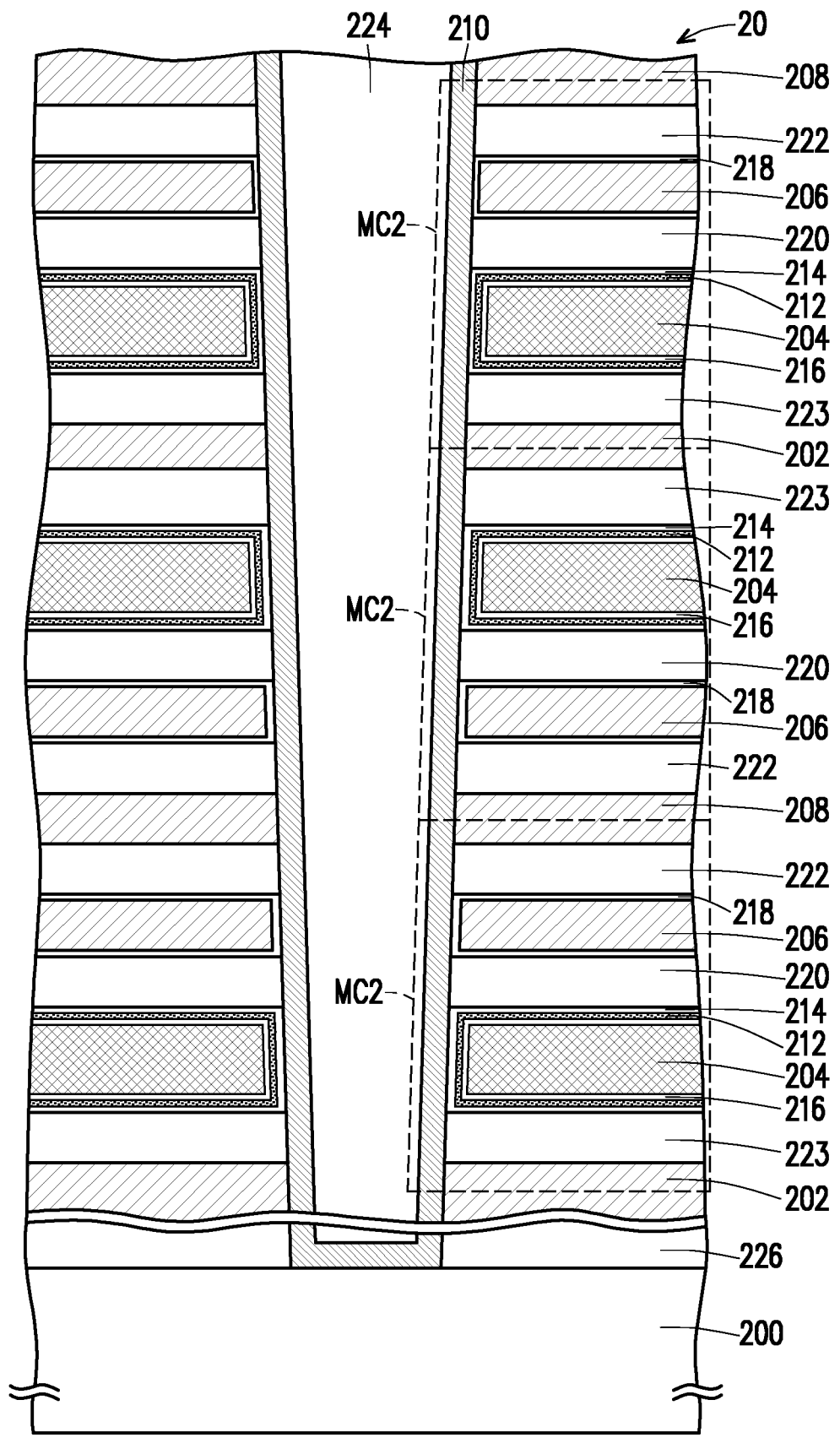
FIG. 2 is a cross-sectional view illustrating a memory structure according to another embodiment of the invention.

FIG. 2 is a cross-sectional view illustrating a memory structure according to another embodiment of the invention.

Referring to FIG. 2, the memory structure 20 includes a substrate 200 and memory cells MC2. The memory structure 20 may be a 3D NOR flash memory structure. The substrate 200 may be a semiconductor substrate such as a silicon substrate. In addition, the required doped region (not shown) may be formed in the substrate 200 according to product design requirements.

The memory cells MC2 are stacked on the substrate 200. Each of the memory cells MC2 includes a conductive layer 202, a gate 204, a gate 206, a conductive layer 208, a channel layer 210, and a charge storage layer 212. The conductive layer 202, the gate 204, the gate 206, and the conductive layer 208 are sequentially stacked. The conductive layer 202 and the gate 204 are electrically insulated from each other. The gate 204 and the gate 206 are electrically insulated from each other. The gate 206 and the conductive layer 208 are electrically insulated from each other. The materials of the conductive layer 202, the gate 206, and the conductive layer 208 are, for example, doped polysilicon. The material of the gate 204 is, for example, metal such as tungsten.

The channel layer 210 is located on one side of the conductive layer 202, one side of the gate 204, one side of the gate 206, and one side of the conductive layer 208. In some embodiments, the channel layer 210 may have a cross-sectional shape similar to a U shape. The material of the channel layer 210 is, for example, a semiconductor material. In some embodiments, the semiconductor material is, for example, polysilicon. The gate 204 and the gate 206 are electrically insulated from the channel layer 210. The conductive layer 202 and the conductive layer 208 are electrically connected to the channel layer 210. In the present embodiment, the conductive layer 202 may directly contact the channel layer 210, and the conductive layer 208 may directly contact the channel layer 210.

The charge storage layer 212 is located between the gate 204 and the channel layer 210. The charge storage layer 212 may further be located between the gate 204 and the conductive layer 202 and between the gate 204 and the gate 206. The charge storage layer 212 can be used to store charges. In some embodiments, the charge storage layer 212 may have an insulating effect. In some embodiments, the charge storage layer 212 may have a U-shaped cross-sectional shape. The material of the charge storage layer 212 is, for example, a charge trapping material. In some embodiments, the charge trapping material is, for example, silicon nitride.

In addition, each of the memory cells MC2 may further include a dielectric layer 214, a dielectric layer 216, a dielectric layer 218, a dielectric layer 220, a dielectric layer 222, and a dielectric layer 223. The dielectric layer 214 is located between the charge storage layer 212 and the channel layer 210 and between the gate 204 and the conductive layer 202. The dielectric layer 214 may further be located between the gate 204 and the gate 206. The dielectric layer 214 may be used as a tunneling dielectric layer. The conductive layer 202 and the gate 204 may be electrically insulated from each other by the dielectric layer 214. The gate 204 and the channel layer 210 may be electrically insulated from each other by the dielectric layer 214. The gate 204 and the gate 206 may be electrically insulated from each other by the dielectric layer 214. In some embodiments, the dielectric layer 214 may have a U-shaped cross-sectional shape. The material of the dielectric layer 214 is, for example, silicon oxide.

The dielectric layer 216 is located between the gate 204 and the charge storage layer 212. The dielectric layer 216 may be used as a blocking dielectric layer. The conductive layer 202 and the gate 204 may be electrically insulated from each other by the dielectric layer 216. The gate 204 and the channel layer 210 may be electrically insulated from each other by the dielectric layer 216. The gate 204 and the gate 206 may be electrically insulated from each other by the dielectric layer 216. In some embodiments, the dielectric layer 216 may have a U-shaped cross-sectional shape. The material of the dielectric layer 216 is, for example, silicon oxide.

The dielectric layer 218 is located between the gate 206 and the channel layer 210. The dielectric layer 218 may further be located between the gate 206 and the dielectric layer 220 and between the gate 206 and the dielectric layer 222. The gate 206 and the channel layer 210 may be electrically insulated from each other by the dielectric layer 218. The gate 206 and the gate 204 may be electrically insulated from each other by the dielectric layer 218. The gate 206 and the conductive layer 208 may be electrically insulated from each other by the dielectric layer 218. In some embodiments, the dielectric layer 218 may have a U-shaped cross-sectional shape. The material of the dielectric layer 218 is, for example, silicon oxide.

The dielectric layer 220 is located between the gate 204 and the gate 206. For example, the dielectric layer 220 may be located between the dielectric layer 214 and the dielectric layer 218. The gate 204 and the gate 206 may be electrically insulated from each other by the dielectric layer 220. The material of the dielectric layer 220 is, for example, silicon oxide.

The dielectric layer 222 is located between the gate 206 and the conductive layer 208. For example, the dielectric layer 222 may be located between the dielectric layer 218 and the conductive layer 208. The gate 206 and the conductive layer 208 may be electrically insulated from each other by the dielectric layer 222. The material of the dielectric layer 222 is, for example, silicon oxide.

The dielectric layer 223 is located between the dielectric layer 214 and the conductive layer 202. The conductive layer 202 and the gate 204 may be electrically insulated from each other by the dielectric layer 223. The material of the dielectric layer 223 is, for example, silicon oxide.

In some embodiments, the memory structure 20 may further include at least one of a dielectric layer 224 and a dielectric layer 226. The dielectric layer 224 is located on the channel layer 210. The material of the dielectric layer 224 is, for example, silicon oxide. The dielectric layer 226 is located between the memory cell MC2 and the substrate 200. The material of the dielectric layer 226 is, for example, silicon oxide.

In the present embodiment, two adjacent memory cells MC2 may share the conductive layer 202. The components in the two adjacent memory cells MC2 sharing the conductive layer 202 may have a symmetrical configuration relationship. In the present embodiment, two adjacent memory cells MC2 may share the conductive layer 208. The components in the two adjacent memory cells MC2 sharing the conductive layer 208 may have a symmetrical configuration relationship.

Based on the above embodiments, in the memory structure 20, the memory cells MC2 are stacked on the substrate 200, each of the memory cells MC2 has the conductive layer 202, the gate 204, the gate 206, and the conductive layer 208 sequentially stacked, and the charge storage layer 212 is located between the gate 204 and the channel layer 210. When operating the memory cell MC2, the gate 204 can be used as a control gate, the gate 206 can be used as an assist gate, the conductive layer 202 can be electrically connected to the bit line, and the conductive layer 208 can be electrically connected to the source line. Therefore, the source side injection method can be used to program the memory cell MC2, thereby improving the programming efficiency. In addition, since the memory cell MC2 can have the assist gate, the design of the memory cell MC2 is more flexible.

Figure 3:
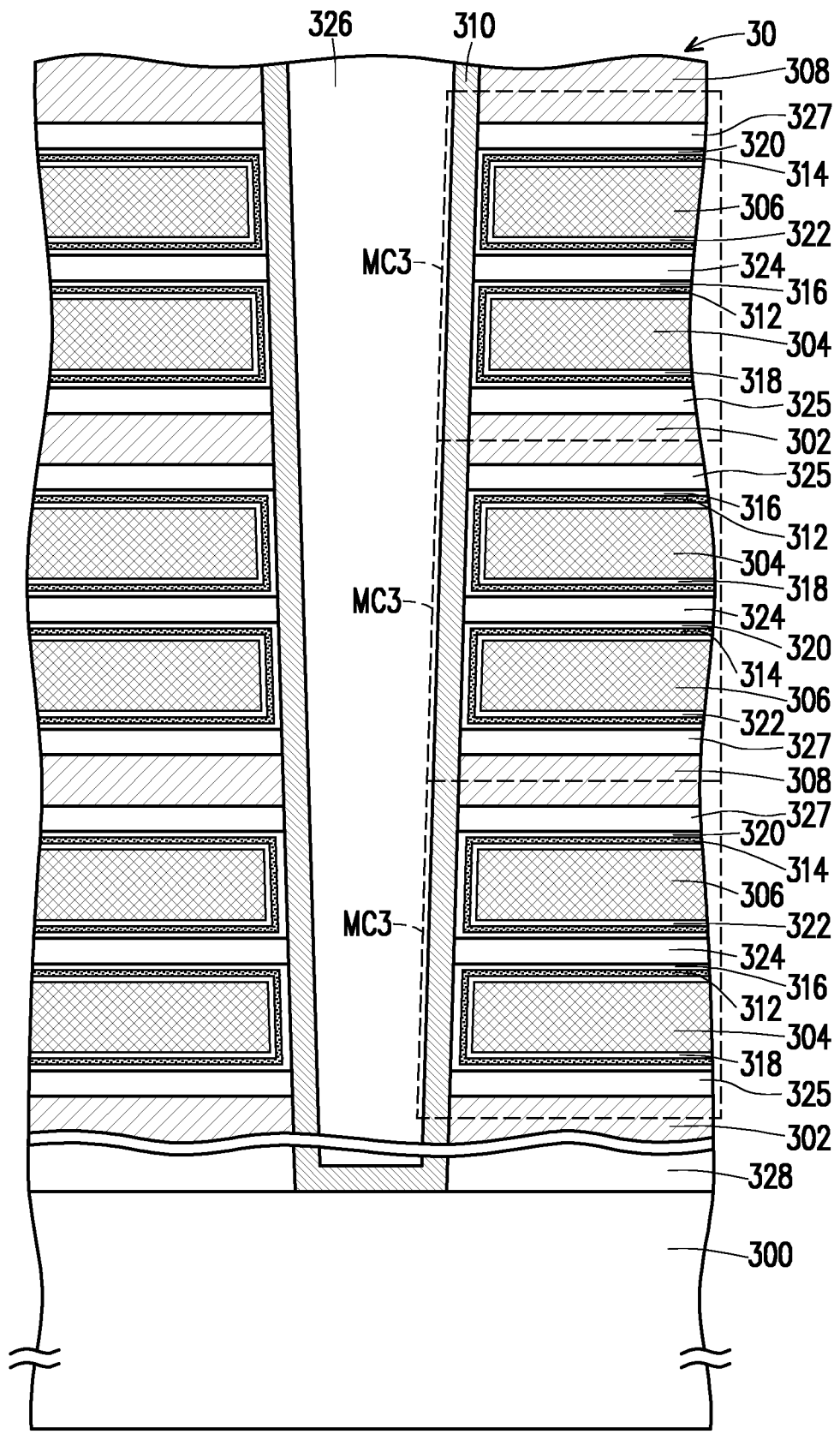
FIG. 3 is a cross-sectional view illustrating a memory structure according to another embodiment of the invention.

FIG. 3 is a cross-sectional view illustrating a memory structure according to another embodiment of the invention.

Referring to FIG. 3, the memory structure 30 includes a substrate 300 and memory cells MC3. The memory structure 30 may be a 3D NOR flash memory structure. The substrate 300 may be a semiconductor substrate such as a silicon substrate. In addition, the required doped region (not shown) may be formed in the substrate 300 according to product design requirements.

The memory cells MC3 are stacked on the substrate 300. Each of the memory cells MC3 includes a conductive layer 302, a gate 304, a gate 306, a conductive layer 308, a channel layer 310, and a charge storage layer 312. The conductive layer 302, the gate 304, the gate 306, and the conductive layer 308 are sequentially stacked. The conductive layer 302 and the gate 304 are electrically insulated from each other. The gate 304 and the gate 306 are electrically insulated from each other. The gate 306 and the conductive layer 308 are electrically insulated from each other. The materials of the conductive layer 302 and the conductive layer 308 are, for example, doped polysilicon. The materials of gate 304 and gate 306 are, for example, metal such as tungsten.

The channel layer 310 is located on one side of the conductive layer 302, one side of the gate 304, one side of the gate 306, and one side of the conductive layer 308. In some embodiments, the channel layer 310 may have a cross-sectional shape similar to a U shape. The material of the channel layer 310 is, for example, a semiconductor material. In some embodiments, the semiconductor material is, for example, polysilicon. The gate 304 and the gate 306 are electrically insulated from the channel layer 310. The conductive layer 302 and the conductive layer 308 are electrically connected to the channel layer 310. In the present embodiment, the conductive layer 302 may directly contact the channel layer 310, and the conductive layer 308 may directly contact the channel layer 310.

The charge storage layer 312 is located between the gate 304 and the channel layer 310. The charge storage layer 312 may further be located between the gate 304 and the conductive layer 302 and between the gate 304 and the gate 306. The charge storage layer 312 can be used to store charges. In some embodiments, the charge storage layer 312 may have an insulating effect. In some embodiments, the charge storage layer 312 may have a U-shaped cross-sectional shape. The material of the charge storage layer 312 is, for example, a charge trapping material. In some embodiments, the charge trapping material is, for example, silicon nitride.

Furthermore, each of the memory cells MC3 may further include a charge storage layer 314. The charge storage layer 314 is located between the gate 306 and the channel layer 310. The charge storage layer 314 may further be located between the gate 306 and the conductive layer 308 and between the gate 306 and the gate 304. The charge storage layer 314 can be used to store charges. In some embodiments, the charge storage layer 314 may have an insulating effect. In some embodiments, the charge storage layer 314 may have a U-shaped cross-sectional shape. The material of the charge storage layer 314 is, for example, a charge trapping material. In some embodiments, the charge trapping material is, for example, silicon nitride.

In addition, each of the memory cells MC3 may further include a dielectric layer 316, a dielectric layer 318, a dielectric layer 320, a dielectric layer 322, a dielectric layer 324, a dielectric layer 325, and a dielectric layer 327. The dielectric layer 316 is located between the charge storage layer 312 and the channel layer 310, between the gate 304 and the conductive layer 302, and between the gate 304 and the gate 306. The dielectric layer 316 may be used as a tunneling dielectric layer. The conductive layer 302 and the gate 304 may be electrically insulated from each other by the dielectric layer 316. The gate 304 and the channel layer 310 may be electrically insulated from each other by the dielectric layer 316. The gate 304 and the gate 306 may be electrically insulated from each other by the dielectric layer 316. In some embodiments, the dielectric layer 316 may have a U-shaped cross-sectional shape. The material of the dielectric layer 316 is, for example, silicon oxide.

The dielectric layer 318 is located between the gate 304 and the charge storage layer 312. The dielectric layer 318 may be used as a blocking dielectric layer. The conductive layer 302 and the gate 304 may be electrically insulated from each other by the dielectric layer 318. The gate 304 and the channel layer 310 may be electrically insulated from each other by the dielectric layer 318. The gate 304 and the gate 306 may be electrically insulated from each other by the dielectric layer 318. In some embodiments, the dielectric layer 318 may have a U-shaped cross-sectional shape. The material of the dielectric layer 318 is, for example, silicon oxide.

The dielectric layer 320 is located between the charge storage layer 314 and the channel layer 310, between the gate 306 and the conductive layer 308, and between the gate 306 and the gate 304. The dielectric layer 320 may be used as a tunneling dielectric layer. The gate 306 and the conductive layer 308 may be electrically insulated from each other by the dielectric layer 320. The gate 306 and the channel layer 310 may be electrically insulated from each other by the dielectric layer 320. The gate 304 and the gate 306 may be electrically insulated from each other by the dielectric layer 320. In some embodiments, the dielectric layer 320 may have a U-shaped cross-sectional shape. The material of the dielectric layer 320 is, for example, silicon oxide.

The dielectric layer 322 is located between the gate 306 and the charge storage layer 314. The dielectric layer 322 may be used as a blocking dielectric layer. The gate 306 and the conductive layer 308 may be electrically insulated from each other by the dielectric layer 322. The gate 306 and the channel layer 310 may be electrically insulated from each other by the dielectric layer 322. The gate 304 and the gate 306 may be electrically insulated from each other by the dielectric layer 322. In some embodiments, the dielectric layer 322 may have a U-shaped cross-sectional shape. The material of the dielectric layer 322 is, for example, silicon oxide.

The dielectric layer 324 is located between the dielectric layer 316 and the dielectric layer 320 between the gate 304 and the gate 306. The gate 304 and the gate 306 may be electrically insulated from each other by the dielectric layer 324. The material of the dielectric layer 324 is, for example, silicon oxide.

The dielectric layer 325 is located between the dielectric layer 316 and the conductive layer 302. The conductive layer 302 and the gate 304 may be electrically insulated from each other by the dielectric layer 325. The material of the dielectric layer 325 is, for example, silicon oxide.

The dielectric layer 327 is located between the dielectric layer 320 and the conductive layer 308. The gate 306 and the conductive layer 308 may be electrically insulated from each other by the dielectric layer 327. The material of the dielectric layer 327 is, for example, silicon oxide.

In some embodiments, the memory structure 30 may further include at least one of a dielectric layer 326 and a dielectric layer 328. The dielectric layer 326 is located on the channel layer 310. The material of the dielectric layer 326 is, for example, silicon oxide. The dielectric layer 328 is located between the memory cell MC3 and the substrate 300. The material of the dielectric layer 328 is, for example, silicon oxide.

In the present embodiment, two adjacent memory cells MC3 may share the conductive layer 302. The components in the two adjacent memory cells MC3 sharing the conductive layer 302 may have a symmetrical configuration relationship. In the present embodiment, two adjacent memory cells MC3 may share the conductive layer 308. The components in the two adjacent memory cells MC3 sharing the conductive layer 308 may have a symmetrical configuration relationship.

Based on the above embodiments, in the memory structure 30, the memory cells MC3 are stacked on the substrate 300, each of the memory cells MC3 has the conductive layer 302, the gate 304, the gate 306, and the conductive layer 308 sequentially stacked, and the charge storage layer 312 is located between the gate 304 and the channel layer 310. In addition, each of the memory cells MC3 may further include the charge storage layer 314, and the charge storage layer 314 is located between the gate 306 and the channel layer 310. Since the memory cell MC3 has the charge storage layer 312 and the charge storage layer 314 separated from each other, the memory cell MC3 can include a first bit that uses the charge storage layer 312 to store charges and a second bit that uses the charge storage layer 314 to store charges, thereby increasing the bit density.

When operating the first bit in the memory cell MC3, the gate 304 can be used as a control gate, the gate 306 can be used as an assist gate, the conductive layer 302 can be electrically connected to the bit line, and the conductive layer 308 can be electrically connected to the source line. Therefore, the source side injection method can be used to program the first bit of the memory cell MC3, thereby improving the programming efficiency. Moreover, when operating the second bit in the memory cell MC3, the gate 304 can be used as an assist gate, the gate 306 can be used as a control gate, the conductive layer 302 can be electrically connected to the source line, and the conductive layer 308 can be electrically connected to the bit line. Therefore, the source side injection method can be used to program the second bit of the memory cell MC3, thereby improving the programming efficiency. On the other hand, since the memory cell MC3 can have the assist gate, the design of the memory cell MC3 is more flexible.

In summary, in the memory structure of the aforementioned embodiments, the memory cells are stacked on the substrate. Since each of the memory cells has the control gate and the assist gate, the source side injection method can be used to program the memory cell, thereby improving the programming efficiency.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
 a substrate; and
 memory cells stacked on the substrate, wherein each of the memory cells comprises:
  a first conductive layer, a first gate, a second gate, and a second conductive layer sequentially stacked, wherein the first conductive layer and the first gate are electrically insulated from each other, the first gate and the second gate are electrically insulated from each other, and the second gate and the second conductive layer are electrically insulated from each other;
  a channel layer located on one side of the first conductive layer, one side of the first gate, one side of the second gate, and one side of the second conductive layer, wherein the first gate and the second gate are electrically insulated from the channel layer, and the first conductive layer and the second conductive layer are electrically connected to the channel layer; and
  a first charge storage layer located between the first gate and the channel layer,
 wherein
  a bottom surface of the channel layer is lower than a bottom surface of the first conductive layer and a bottom surface of the second conductive layer in a memory cell closest to the substrate among the memory cells.

2. The memory structure according to claim 1, wherein each of the memory cells further comprises:
 a first dielectric layer located between the first charge storage layer and the channel layer and between the first gate and the first conductive layer;
 a second dielectric layer located between the first gate and the first charge storage layer;
 a third dielectric layer located between the first conductive layer and the channel layer, between the first dielectric layer and the channel layer, between the second gate and the channel layer, and between the second conductive layer and the channel layer;
 a fourth dielectric layer located between the first gate and the second gate;
 a fifth dielectric layer located between the second gate and the second conductive layer; and
 a sixth dielectric layer located between the first dielectric layer and the first conductive layer, wherein
 the first conductive layer is electrically connected to the channel layer by a dielectric breakdown of the third dielectric layer located between the first conductive layer and the channel layer, and
 the second conductive layer is electrically connected to the channel layer by a dielectric breakdown of the third dielectric layer located between the second conductive layer and the channel layer.

3. The memory structure according to claim 2, wherein the third dielectric layer is a continuous structure located on one side of the first conductive layer, one side of the first gate, one side of the second gate, and one side of the second conductive layer.

4. The memory structure according to claim 1, wherein each of the memory cells further comprises:
 a first dielectric layer located between the first charge storage layer and the channel layer and between the first gate and the first conductive layer;
 a second dielectric layer located between the first gate and the first charge storage layer;
 a third dielectric layer located between the second gate and the channel layer;
 a fourth dielectric layer located between the first gate and the second gate;
 a fifth dielectric layer located between the second gate and the second conductive layer; and
 a sixth dielectric layer located between the first dielectric layer and the first conductive layer.

5. The memory structure according to claim 4, wherein the first conductive layer directly contacts the channel layer, and the second conductive layer directly contacts the channel layer.

6. The memory structure according to claim 4, wherein the third dielectric layer is further located between the second gate and the fourth dielectric layer and between the second gate and the fifth dielectric layer.

7. The memory structure according to claim 1, wherein each of the memory cells further comprises:
 a second charge storage layer located between the second gate and the channel layer.

8. The memory structure according to claim 7, wherein each of the memory cells further comprises:
 a first dielectric layer located between the first charge storage layer and the channel layer, between the first gate and the first conductive layer, and between the first gate and the second gate;
 a second dielectric layer located between the first gate and the first charge storage layer;
 a third dielectric layer located between the second charge storage layer and the channel layer, between the second gate and the second conductive layer, and between the second gate and the first gate;
 a fourth dielectric layer located between the second gate and the second charge storage layer;
 a fifth dielectric layer located between the first dielectric layer and the third dielectric layer between the first gate and the second gate;
 a sixth dielectric layer located between the first dielectric layer and the first conductive layer; and a seventh dielectric layer located between the third dielectric layer and the second conductive layer.

9. The memory structure according to claim 8, wherein the first conductive layer directly contacts the channel layer, and the second conductive layer directly contacts the channel layer.

10. The memory structure according to claim 1, wherein two adjacent memory cells share the first conductive layer.

11. The memory structure according to claim 10, wherein components in the two adjacent memory cells sharing the first conductive layer have a symmetrical configuration relationship.

12. The memory structure according to claim 1, wherein two adjacent memory cells share the second conductive layer.

13. The memory structure according to claim 12, wherein components in the two adjacent memory cells sharing the second conductive layer have a symmetrical configuration relationship.

14. The memory structure according to claim 1, wherein materials of the first conductive layer, the second gate, and the second conductive layer comprise doped polysilicon, and a material of the first gate comprises metal.

15. The memory structure according to claim 1, wherein materials of the first conductive layer and the second conductive layer comprise doped polysilicon, and materials of the first gate and the second gate comprise metal.

16. The memory structure according to claim 1, wherein a material of the channel layer comprises a semiconductor material.

17. The memory structure according to claim 16, wherein the semiconductor material comprises polysilicon.

18. The memory structure according to claim 1, wherein a material of the first charge storage layer comprises a charge trapping material.

19. The memory structure according to claim 18, wherein the charge trapping material comprises silicon nitride.

20. The memory structure according to claim 1, wherein the memory structure comprises a three-dimensional NOR flash memory structure.

* * * * *